United States Patent [19]
Gleason et al.

[11] Patent Number: 6,045,877
[45] Date of Patent: Apr. 4, 2000

[54] PYROLYTIC CHEMICAL VAPOR DEPOSITION OF SILICONE FILMS

[75] Inventors: Karen K. Gleason, Lexington, Mass.; Michael C. Kwan, Mountain View, Calif.

[73] Assignee: Massachusetts Institute of Technology, Cambridge, Mass.

[21] Appl. No.: 09/123,114

[22] Filed: Jul. 27, 1998

Related U.S. Application Data

[60] Provisional application No. 60/053,884, Jul. 28, 1997.

[51] Int. Cl.[7] ....................................................... C08F 2/46
[52] U.S. Cl. .......................... 427/522; 427/515; 427/535; 427/255.18; 427/397.7; 427/534
[58] Field of Search ...................................... 427/489, 515, 427/255.18, 255.6, 534, 535, 522, 397.7

[56] References Cited

U.S. PATENT DOCUMENTS

| | | | |
|---|---|---|---|
| 3,319,311 | 5/1967 | Mutter | 29/25.3 |
| 4,085,248 | 4/1978 | Zehender et al. | 428/336 |
| 4,435,476 | 3/1984 | Phillips et al. | 428/412 |
| 4,546,008 | 10/1985 | Saitoh et al. | 427/38 |
| 4,894,254 | 1/1990 | Nakayama et al. | 427/38 |
| 5,160,544 | 11/1992 | Garg et al. | 118/724 |
| 5,298,290 | 3/1994 | Jost et al. | 427/489 |
| 5,320,875 | 6/1994 | Hu et al. | 427/493 |
| 5,439,780 | 8/1995 | Joshi et al. | 430/296 |
| 5,521,126 | 5/1996 | Okamura et al. | 437/235 |
| 5,576,068 | 11/1996 | Caburet et al. | 427/452 |
| 5,888,591 | 3/1999 | Gleason et al. | 427/522 |

FOREIGN PATENT DOCUMENTS 7-018076  1/1995  Japan .

OTHER PUBLICATIONS

Chawla, "Evaluation of plasma polymerized hexamethylcyclotrisiloxane biomaterials towards adhesion of canine platelets and leucocytes," *Biomaterials*, vol. 2, pp. 83–88, Apr. 1981.

Sakata et al., "Plasma Polymerized Membranes and Gas Permeability. II," *Journal of Applied Polymer Science*, vol. 31, pp. 1999–2006, 1986. No month data.

Fukui et al., "Surface modification of pigments by the chemical vapour deposition of cyclic dimenthylsiloxane," *Jocca–Surface Coatings Int'l*, V. 75, No. 10, pp. 411–412, 414–418, Oct. 1992.

Tajima, et al., "Characterization of Plasma Polymers from Tetramethylsilane, Octamethylcyclo–tetrasiloxane, and Methyltrimethoxysilane," *Journal of Polymer Science: Part A: Polymer Chemistry*, vol. 25, pp. 1737–1744, 1987. No month data.

Kwan, "Hot–Filament Chemical Vapor Deposition of Selectively Deposited Diamond and Silicone Thin Films," Massachusetts Institute of Technology Ph.D. Thesis, Sep., 1997. No page number.

*Primary Examiner*—Roy V. King
*Attorney, Agent, or Firm*—Theresa A. Lober

[57] ABSTRACT

Provided are pyrolytic chemical vapor deposition techniques for producing thin silicone-like films by way of processes that eliminate electron impact, ion bombardment, and UV irradiation events. To form a silicone film on a surface of a structure in accordance with the invention, the structure surface is exposed to a substantially electrically neutral reactive gaseous phase that includes organosilicon molecular fragments, while the structure surface is maintained substantially at a temperature lower than that of the reactive gaseous phase. An organosilicon compound is exposed to a pyrolyzing environment, where the conditions of the pyrolyzing environment are characterized as producing, in the vicinity of the structure surface, a substantially electrically neutral reactive gaseous phase that includes organosilicon molecular fragments. The structure surface is maintained substantially at a temperature lower than that of the pyrolyzing environment. A plasma environment can be provided simultaneously with the pyrolyzing environment, and can be further provided before or after the pyrolyzing environment. Silicone films of the invention are mechanically robust, environmentally stable, and photosensitive.

24 Claims, 9 Drawing Sheets

29Si PYROLYTIC CVD SILICONE FILM SPECTRUM (✱ = SPINNING SIDE BANDS)

29Si PDMS SPECTRUM

29Si D4 SPECTRUM $^{29}$Si PECVD SILICONE FILM SPECTRUM

PYROLYTIC CHEMICAL VAPOR DEPOSITION OF SILICONE FILMS

This application claims the benefit of U.S. Provisional Application Ser. No. 60/053,884, filed Jul. 28, 1997.

GOVERNMENT RIGHTS IN THE INVENTION

This invention was made with U.S. Government support under Contract Number N00014-94-1-0908 awarded by the Office of Naval Research, and under Contract Number N01-NS-6-2350, awarded by the National Institutes of Health. The U.S. Government has certain rights in this invention.

BACKGROUND OF THE INVENTION

This invention relates to silicones, and more particularly relates to techniques for producing silicone films.

In a broad sense, silicones are a class of polymers which consist of a repeating Si—O backbone with organic functional groups attached to the Si via Si—C bonds. A more precise term for this class of polymers is polyorganosiloxanes. The most common polyorganosiloxane is a linear polymer with two methyl groups per silicon atom, resulting in poly(dimethylsiloxane), or PDMS.

Silicones occupy an intermediate position between organic and inorganic compounds, specifically between silicates and organic polymers. This dual nature gives silicones considerable flexibility, lending them to a wide range of applications. Indeed, bulk silicones are available in many forms, ranging from low viscosity oils to highly-crosslinked resins and rubbers; and are used in applications ranging from caulk and paint additives to electronics and electrical connection encapsulation. In the field of biomedical applications, silicones are one of the most widely studied biomaterials, having been employed for medical implants, joint replacements, heart valves, catheters, intraocular lenses, and a range of other biomedical applications. In general, silicones are found to be one of the most biocompatible, long-term medical materials yet developed.

There is considerable and increasing interest in the production of silicone films, and particularly silicone thin films, for a variety of real and potential applications not addressed by the bulk material. In the biomedical field, silicone films are important for providing adherent, conformal coatings on implantable devices having complex topologies and small dimensions. In other applications, silicone films are well-suited as protective coatings for optical devices, as well as films for permselective membranes, abrasion- and corrosion-resistant coatings, photolithographic photoresists, optical components, and films for environmental sensors, among other applications.

Investigations into the production of silicone films have primarily focused on various plasma enhanced chemical vapor deposition (PECVD) techniques. PECVD involves the formation of a polymer film on a surface exposed to a vapor phase precursor in a plasma state that is produced by, e.g., radio frequency (RF) excitation. Specifically, the plasma is a partially ionized precursor gas, typically formed by exposing a gaseous monomer to an electric field at a relatively low pressure, and consists of electrons, ions, free radicals, molecules in excited states, and photons of various energies. Reactive species are generated in the plasma by various charged particle interactions such as electron impact collisions. Under appropriate conditions, these reactive species polymerize and deposit on an exposed surface to form a polymer silicone film. A wide range of monomers and plasma conditions have been investigated for producing PECVD silicone films.

It has been generally accepted that electron impact events in the plasma are responsible for the initiation of monomer fragmentation processes which lead to PECVD polymer formation and film growth. It has further been established that the UV radiation from the plasma causes UV photolysis of monomer groups which enables an intermediate polymer chain growth process. Bombardment of the growing film by ions and UV irradiation from the plasma is also understood to effect film growth, specifically by creating active sites for film growth.

But electron impact fragmentation of a monomer gas in the plasma, as well as bombardment of a growing film with ions and with UV radiation from the plasma, are known to result in various unwanted atomic rearrangements in the film as well as trapping of defects in the film. One predominant defect is that of trapped free radicals, or dangling bonds. Upon exposure to atmosphere, such dangling bonds are oxidized, leading to concomitant changes in film structure and properties over time. This aging effect, known to be characteristic of PECVD polymer films, renders such films inadequate for many applications.

In addition, the ion bombardment that is characteristic of PECVD processes has the effect of increasing the crosslinking density of a PECVD polymer film over that of the conventional polymer. Increased cross linking density typically renders the film inflexible or even brittle. PECVD silicone films are also typically characterized by a high dielectric loss when compared with the conventional bulk polymer. Thus, although it has been established that ion bombardment and electron impact events play a role in the formation of a silicone film in a PECVD process, such are also found to result in degradation of film properties.

SUMMARY OF THE INVENTION

The invention provides pyrolytic chemical vapor deposition techniques for producing thin films by way of processes that eliminate electron impact, ion bombardment, and UV irradiation events. In this way, the deposition processes of the invention enable production of silicone-like films that do not include the defects characteristic of films produced by plasma enhanced chemical vapor deposition techniques.

In a method for forming a silicone film on a surface of a structure in accordance with the invention, the structure surface is exposed to a substantially electrically neutral reactive gaseous phase that includes organosilicon molecular fragments, while the structure surface is maintained substantially at a temperature lower than that of the reactive gaseous phase. In one process for carrying out this technique, an organosilicon compound is exposed to a pyrolyzing environment. The conditions of the pyrolyzing environment are characterized as producing, in the vicinity of a structure surface on which a silicone film is to be formed, a substantially electrically neutral reactive gaseous phase that includes organosilicon molecular fragments. The structure surface is maintained substantially at a temperature lower than that of the pyrolyzing environment.

The organosilicon compound to be exposed to the pyrolyzing environment can be, e.g., a silane or a siloxane, e.g., octamethylcyclotetrasiloxane, or other suitable compound. The pyrolyzing environment can be a resistively-heated conducting filament or other suitable structure. The reactive gaseous phase and the pyrolyzing environment are characterized by a temperature that is preferably less than about 800° C., and the structure surface is maintained at a temperature that is preferably less than about 175° C.

The structure on which a film is to be deposited can be, e.g., a length of wire, a neural probe, a neurological electrode assembly, a microfabrication substrate such as a silicon wafer, or any of a wide range of structures, including complicated and miniature features.

The film deposition method can be adapted to include a first step of exposing the organosilicon compound to a plasma environment, to a last step of exposing the organosilicon compound to a plasma environment, or to one or more steps of exposing the organosilicon compound to a pyrolyzing environment while simultaneously exposing the organosilicon compound to a plasma environment. Here the plasma environment can be produced by, e.g., continuous plasma excitation power, by an excitation power characterized by an excitation duty cycle having alternating intervals in which plasma excitation power is applied and in which no plasma excitation power is applied, or by other suitable plasma excitation power.

In one example process in accordance with the invention, the substrate is exposed to the reactive gaseous phase while being maintained at the lower temperature for a time selected to deposit on the structure surface a silicone film of a desired thickness. Then the deposited silicone film is exposed to a pattern of radiation sufficient to photooxidize the silicone film, e.g., by exposing the film through a patterned mask to radiation of between about, e.g., 10 nm and about 400 nm in wavelength. Areas of the silicone film that are not photooxidized are then etched. In accordance with the invention, all of these steps can be carried out on a substrate in sequence without exposing the substrate to ambient environment between the steps.

The silicone film etching can be carried out by, e.g., exposing the radiated film to a plasma environment such as an oxygen-containing or other suitable plasma environment, where the conditions of the plasma environment are selected to etch the film areas that are not photooxidized.

The pyrolytic chemical vapor deposition silicone films of the invention can be employed to provide coatings in a wide range of applications, including biomedical devices such as implantable devices, for electronics applications, and for microfabrication processes, particularly as, e.g., photoresists for photolithography processes. The pyrolytic deposition technique of the invention overcomes the deficiencies characteristic of films produced with prior deposition techniques, to better address these applications with a stable and mechanically robust film structure.

Other features and advantages of the invention will be apparent from the claims, and from the following description and accompanying drawings.

DETAILED DESCRIPTION OF THE INVENTION

Figure 1:
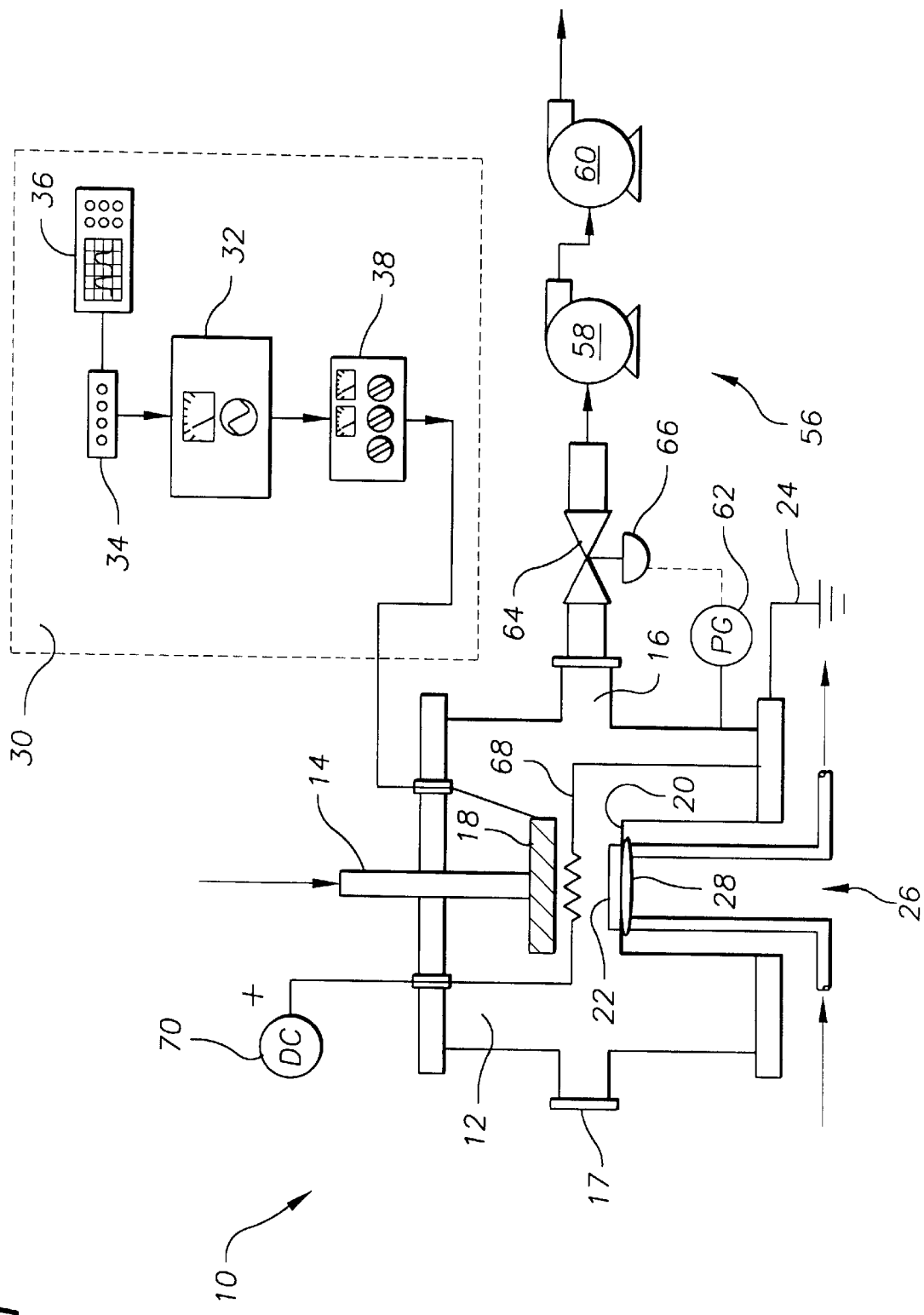
FIG. 1 is a schematic diagram of an example chemical vapor deposition system for carrying out pyrolytic chemical vapor deposition of silicone films in accordance with the invention.

FIG. 1 illustrates an example chemical vapor deposition chamber 10 in which to carry out the pyrolytic chemical vapor deposition techniques provided by the invention. The deposition apparatus will first be described, after which the various silicone film deposition techniques provided by the invention will be described. It is preferred that the deposition chamber be configured to accommodate both pyrolytic chemical vapor deposition as well as plasma enhanced chemical vapor deposition so that pyrolytic and plasma processes can be carried out in sequence or simultaneously in a common chamber. as described in detail below, for efficiency of processing.

In one example chamber configuration contemplated by the invention, there is provided a stainless steel vessel 12, e.g., a 20 cm-diameter, 8 cm-high chamber, having a monomer feed port 14 and exhaust pumping port 16. A viewport 17 is preferably provided for enabling a user to visually monitor progress of a deposition cycle.

To enable plasma processes, there is provided in the chamber an upper, powered electrode 18 spaced above a lower, grounded electrode 20 on which is disposed a substrate 22 or other structure on which a silicone film is to be deposited. The powered electrode here can be, e.g., an 11.4 cm-diameter aluminum disk, and the grounded electrode can be, e.g., an 11.4 cm-diameter aluminum cylinder. The gap between the electrodes is preferably variable; e.g., by vertical translation of the lower electrode. For an example electrode gap of about 1 inch, the total reactor volume, excluding the electrode volume, is about 5100 cm$^3$, and the effective volume between the two electrodes is about 261 cm$^3$. As can be recognized the upper electrode can be grounded and the lower electrode powered, as prescribed by a given deposition application.

The upper, powered electrode 18 can be preferably configured with a showerhead fixture (not shown) having an array of spaced-apart tubes through which a monomer can be vertically introduced to the reaction chamber from the monomer feed port 14. Preferably, the showerhead tubes provide a reasonably equal flow of gas per unit area of the upper electrode. Accordingly, the showerhead tubes are preferably spaced such that the concentration of the gas injected out of the showerhead is relatively uniform. The number and spacing of showerhead tubes is dependent upon the specific pressure, electrode gap, temperature, and other process parameters, as can be recognized. For example, for a typical deposition process employing a pressure of about 1 Torr and an electrode gap of about 1 cm, the showerhead tube spacing is preferably about 1 cm.

As can be recognized, other configurations can be employed to introduce the monomer gas to the deposition chamber; the showerhead configuration is only one example. Alternatively, e.g., a symmetrical gas ring-type injector can be configured at the top or bottom of the chamber for introducing monomer to the reaction volume. Other gas delivery systems can also be employed, as can be recognized.

Figure 2:
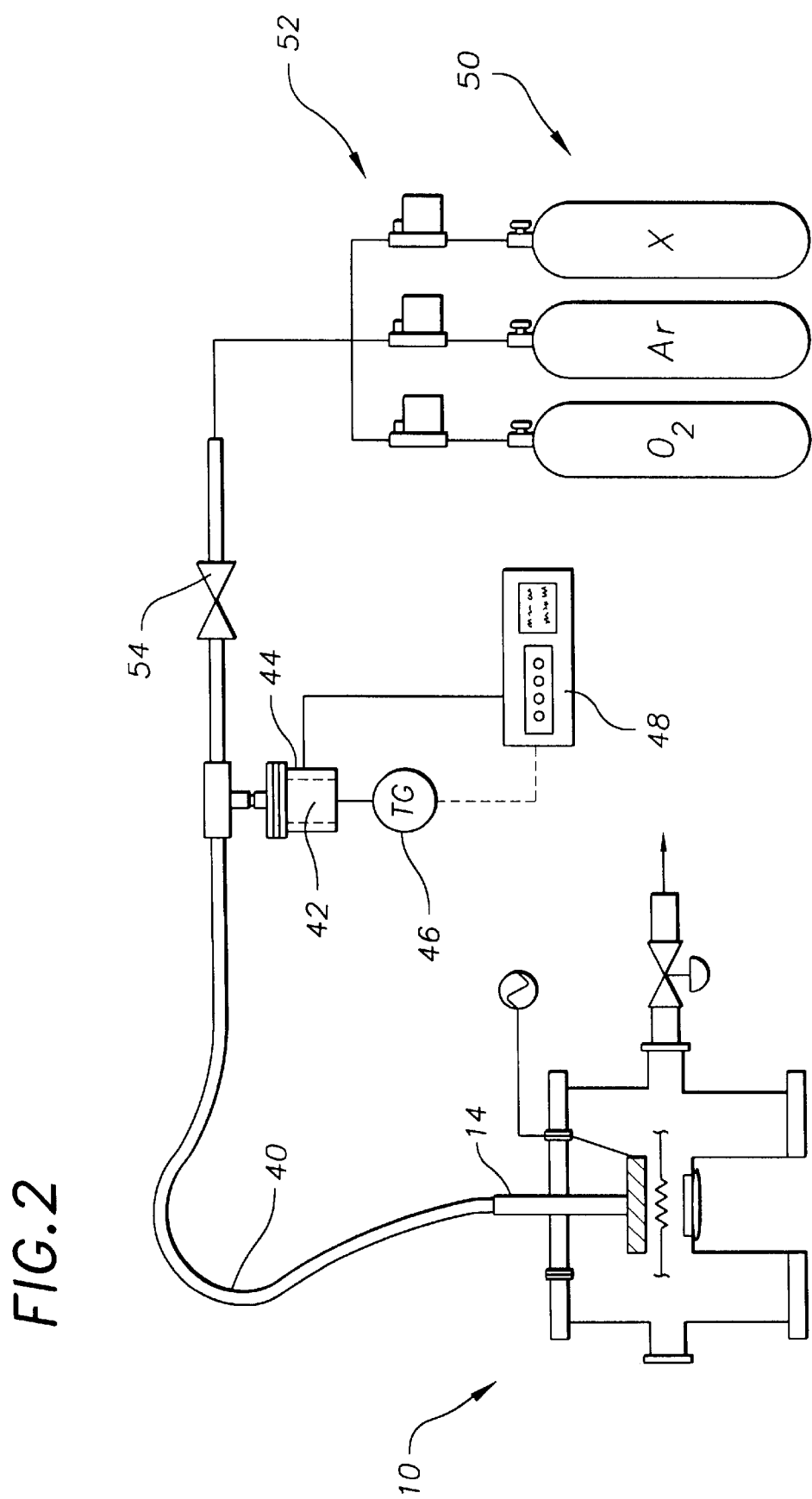
FIG. 2 is an example gas delivery system for introducing monomer gas to the chemical vapor deposition system of FIG. 1.

Referring also to FIG. 2, the monomer feed port 14 is connected by, e.g., a heated flexible steel tube 40 to a monomer gas delivery system. Because many silicone film monomers are liquids or solids at room temperature, for many applications it may be preferable to provide the silicone film monomer in a sample jar 42 maintained at an elevated temperature using, e.g., a band heater controlled by a temperature sensor 46 and temperature controller 48. For many applications, it accordingly may be preferable to provide heated insulation tape around the steel tube delivery line 40. As can be recognized, a liquid flow controller (not shown) can be configured in connection with the sample jar to control flow of the monomer through the delivery tube 40. Delivery of carrier gases, such as $O_2$ and Ar, or other gases, and delivery of gaseous monomers, can be provided in the conventional manner with gas supplies 50 and accompanying mass flow controllers 52. Heated mass flow controllers may be preferable for some applications to prevent condensation in the delivery line. An isolation valve 54 can be included to maintain isolation between flow from the sample jar 42 back to the gas supplies 50.

Referring back to FIG. 1, plasma excitation power is delivered to the upper, powered electrode 18 by a power supply 30, including, e.g., an RF amplifier such as a 13.56 MHz power source model HF-300T from ENI Power System, Inc., having a maximum power output of about 280 W. Power output from this amplifier is controlled by a 0–10 V input control signal. To enable pulsed plasma conditions, the RF power source can be modulated using a pulse generator 34 such as a Datapulse 100A generator from Systron-Donner Corporation. An oscilloscope 36 can be employed to calibrate the pulse duration. Impedance matching of the power source with the chamber can be carried out by, e.g., manual adjustment with an LC network 38 such as the model SA-2060A from Heath Company.

The lower electrode 20 is connected electrically to an electrical ground connection 24 of the chamber. The grounded electrode and its support surface for a substrate or other structure are preferably cooled, e.g., by a coolant loop 26 through which is circulated cooling water or cold nitrogen gas and connected to a cooling coil 28 in thermal connection with the electrode. For high-temperature processes a resistively heated aluminum support plate can be provided as a substrate platen on the electrode. Preferably a temperature controller (not shown) is provided to enable a user to set and maintain a desired electrode temperature during a deposition cycle. A thermocouple is here preferably configured at the location of the electrode surface.

The exhaust pumping port 16 is connected to a pumping system 56 including, e.g., a roots blower 58 and rotary vane pump 60. Pressure in the chamber is monitored by, e.g., a pressure transducer 62 such as the model 222c transducer from MKS Baratron; and controlled by way of, e.g., a butterfly valve 64 such as the model MDV-D15 valve from Vacuum General. Preferably the control is carried out in a feedback loop by, e.g., a feedback pressure controller 66 such as the model 80-2 controller from Vacuum General.

To enable pyrolytic chemical vapor deposition processes, there is provided in the chamber one or more configurations of heated surfaces, e.g., a hot-filament 68, as shown in FIG. 1. The hot-filament or other heated surface is preferably provided in a position in the vicinity of the input monomer gas flow such that the gas is pyrolyzed as it passes through a heated space produced by the heated surface, to thereby form reactive deposition species within the chamber. For example, as shown in FIG. 1, a hot-filament 68 can be positioned just below the showerhead electrode 18 such that monomer gas introduced to the chamber through the showerhead passes over the hot-filament. Preferably, the hot-filament is positioned between about 5 mm and about 10 mm from the structure to be coated.

The hot-filament can be heated by, e.g., resistive heating. In this case, the filament can be connected to a dc voltage source 70 and the electrical ground 24 of the chamber. In this scenario, the hot-filament can be formed of any suitable electrically-conductive material, preferably a high-resistivity metal, e.g., tantalum, tungsten, rhenium, nickel-chromium, or other suitable material. For some applications it can be preferable to enclose the wire in, e.g., a quartz tube or other suitable protective encasement that accommodates the heating function of the wire while protecting the wire from the deposition environment.

Figure 3:
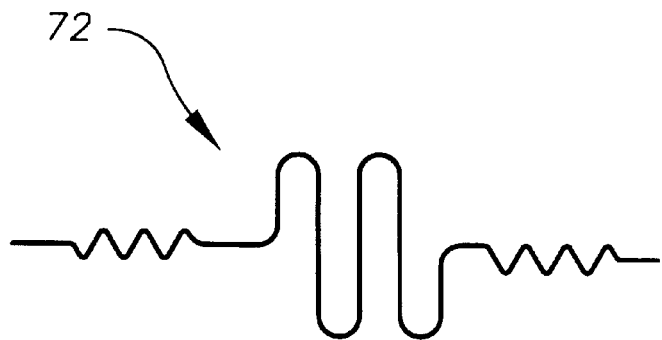
FIG. 3 is an example geometry of a hot-filament to be employed for pyrolysis in accordance with the invention.

The hot-filament is preferably shaped in a configuration that enhances the uniformity of film deposition. For example, referring to FIG. 3, there is shown an example serpentine-shaped hot-filament configuration 72. This serpentine geometry has the advantage of a relatively large area, for enhancing deposition uniformity, and good structural integrity and stability after repeated thermal cycling. As can be recognized, many other hot-filament geometries, e.g., filament coils, can be employed to enhance deposition uniformity. The invention contemplates a range of such geometries, including, e.g., geometries like those described by Garg et al., in U.S. Pat. No. 5,160,544, entitled "Hot Filament Chemical Vapor Deposition Reactor," issued Nov. 3, 1992, the entirety of which is hereby incorporated by reference.

Figure 4:
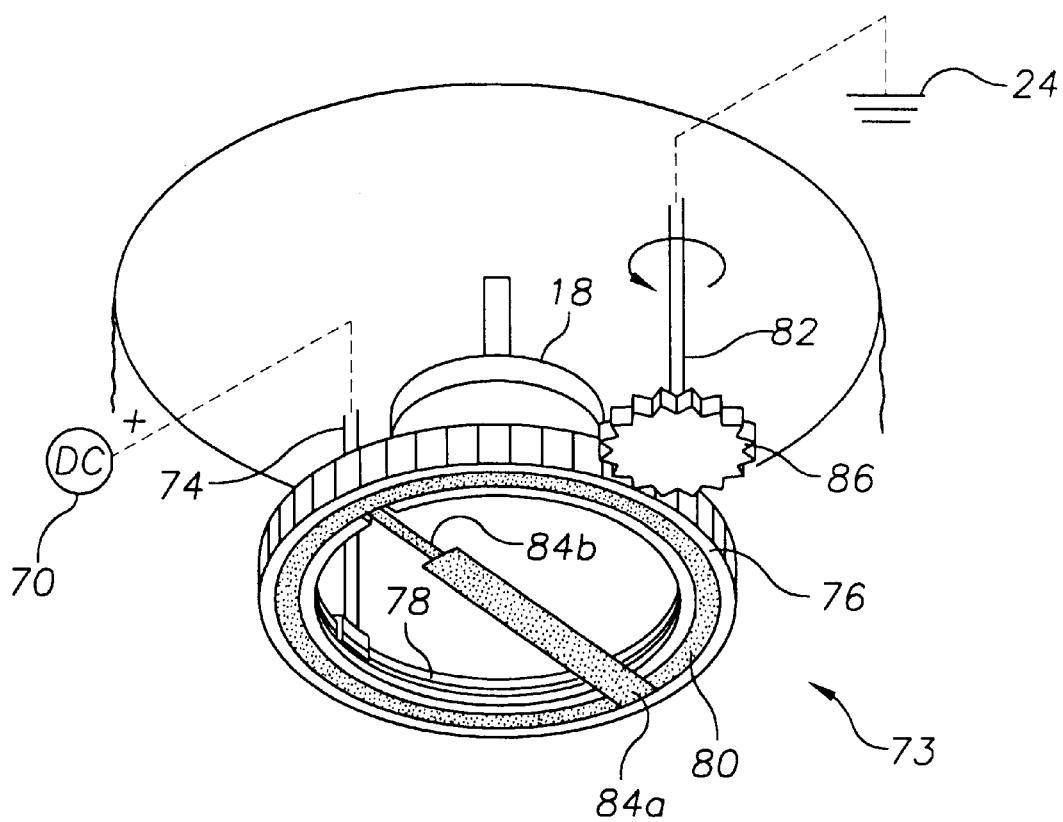
FIG. 4 is an example rotating hot-filament system provided by the invention for enhancing pyrolytic chemical vapor deposition uniformity.

It has been found that even complex hot-filament geometries cannot, in general, ensure very high uniformity of film deposition. Referring to FIG. 4, in accordance with the invention, there is provided a rotating hot-filament system 73 provided to increase the uniformity of film deposition. In one example configuration, as shown, the system consists of a stationary frame 74 hanging from the upper lid of the deposition chamber. The frame supports a disk structure including an outer, copper ring electrode 76 and an inner copper ring electrode 78. The two copper ring electrodes are electrically isolated from each other by an interposed insulator ring 80. A sliding connection to a dc power source 70 is made to the inner copper ring electrode 78 through the stationary frame 74, while a connection to the electrical ground 24 of the chamber is made to the outer copper ring electrode 76 through an electrically-conducting gear rod 82.

In one example configuration, a filament is provided with a low-resistivity, end stub section 84a, connected to a high-resistivity thin-filament section 84b. In one preferable configuration as shown, the low-resistivity stub section 84a comprises about ⅔ of the length of the filament and the thin-filament section 84b comprises the other ⅓ of the filament length. One of either the stub or filament sections is connected at its outer end to the grounded, outer copper electrode, with the remaining section being connected at its outer end to the dc powered, inner copper electrode. This filament configuration provides a higher center-to-edge deposition uniformity profile than could be achieved with, e.g., a conventional, high-resistivity thin-filament, i.e., a filament without the low-resistivity end section. It is recognized, however that for some applications a uniform filament, or other filament configuration, can be preferred.

The outer copper electrode 76 is provided with teeth that correspond to gear teeth 86 of the gear rod 82. As the gear rod is rotated by, e.g., a motor and control mechanism (not shown) external to the deposition chamber, the disk structure rotates, with the stationary frame 74 making sliding contact to the inner copper ring electrode and providing further vertical support of the structure. This rotating hot-filament system provides the ability to precisely control over time the heating of a space just under the monomer feed port 14 of the chamber, whereby uniformity of film deposition can be increased over that of stationary filament configurations. As can be recognized, this rotating filament configuration can be adjusted for various applications. For example, the outer and inner ring electrodes can be formed of any suitable conductor material. Any suitable mechanism can be employed for enabling and controlling rotation of the disk structure; the external motor control mechanism is not required.

As can be recognized, a range of other thermal excitation mechanisms can be employed. Hot windows, electrodes, or other surfaces, as well as heated walls of the deposition chamber, can alternatively be employed. Heated showerhead, heated gas delivery lines, or other direct-pyrolysis configurations can also be employed. For some applications a direct-pyrolysis mechanism such as one of these, or an alternative mechanism, e.g., laser heating, can be preferred to eliminate possible introduction into the growth environment of contaminants from a heated surface such as a hot-filament. Alternative heating configurations, such as those described by Gleason et al., in U.S. Pat. No. 5,888,591, issued Mar. 30, 1999, entitled "Chemical Vapor Deposition of Fluorocarbon Polymer Thin Films," the entirety of which is hereby incorporated by reference, can also be employed.

As can be recognized, if only pyrolytic CVD processes and no plasma enhanced CVD processes are to be carried out to form silicone films in accordance with the invention, then the example chamber described above can be modified to only provide for the pyrolytic environment. No upper electrode need be supplied, and a thermally-conductive but electrically isolated lower support can be substituted for the lower electrode. Monomer gas can be introduced around the lower support. Indeed, as can be recognized, a wide range of pyrolytic chamber geometries can be configured; the only requirement is the ability to produce a reactive gaseous phase in the vicinity of a structure on which a film is to be deposited.

Turning now to the processing conditions prescribed by the pyrolytic chemical vapor deposition processes of the invention, it is first noted that many complex physical phenomena and interactions occur in any chemical vapor deposition (CVD) environment. Experimentally controllable process parameters that affect hot-filament temperature, gas molecule in-chamber residence time, gas density, as well as process gas flow rate, feed gas composition, chamber pressure, chamber reactor geometry, and other factors all directly affect the chemical processes that occur during a pyrolytic CVD process. Further, the surface geometry of a structure to be coated, as well as the chemical composition of the structure, the structure's temperature, and other characteristics of the structure all affect the nature of the surface interactions that occur during a pyrolytic CVD process. Thus, as will be recognized by those skilled in the art, the various process parameters to be described can be adjusted over a wide range to achieve any of a continuum of deposition process conditions. Preferably, the various parameters are controlled such that the deposition process is optimized for a given structure geometry, composition, and application.

In the pyrolytic chemical deposition techniques provided by the invention, thermal, rather than electrical, input excitation is employed to produce reactive monomer gas phase species in a chemical vapor deposition environment that is substantially electrically neutral. Referring back to FIG. 1, the hot-filament 68, or other hot surface, is heated to a temperature that is sufficient to pyrolyze monomer gas introduced through the monomer feed 14. The pyrolyzed monomer gas results in a source of reactive monomer molecular fragments. During the pyrolysis process, a substrate 22 or other structure to be coated is located in the vicinity of the reactive monomer gas fragments and is maintained at a temperature lower than that of the hot-filament such that the reactive species produced in the vicinity of the filament are transported to the substrate, where they deposit and polymerize to produce the desired silicone film.

The invention provides a recognition that the electron impact events and the electron and ion bombardment events characteristic of plasma CVD processes are not required to produce a polymerized CVD silicone film, as had been previously generally accepted. The electron impact and ion bombardment events characteristic of PECVD processes, and which result in degradation of PECVD films, are eliminated by the pyrolytic CVD process of the invention. Unlike a plasma CVD process, in which significant concentrations of electrons and ions are formed and exist in the plasma environment, the pyrolytic CVD process of the invention produces an electrically neutral reactive gas phase environment that includes only uncharged species, e.g., molecular species; electrons and ions are not produced. It is discovered that this electrically neutral reactive gas phase environment is sufficient for polymerization and deposition of a silicone film, specifically without the need for electron impact or ion bombardment events.

Accordingly, it is preferred that the temperature of the hot-filament or other hot surface employed to pyrolyze the monomer be sufficiently high to decompose the monomer gas, but be sufficiently low that thermionic emission from the surface of the heat source is suppressed. This ensures that no electrons are introduced into the reactive gas phase from the filament, and ensures that substantially no electron impact events can occur in the reactive gas phase environment. Most preferably, all electron emission from any surface within the deposition chamber is suppressed. Thereby, pyrolytic decomposition is the fundamental monomer decomposition process carried out to enable the polymer formation. In other words, a pyrolysis decomposition process carried out in accordance with the invention results substantially solely from the heating of molecules, without any reactive agents such as charged particles effecting the thermal reactions. Emission processes other than thermionic electron emission are likewise preferably suppressed in accord with the pyrolysis CVD process of the invention such that molecular heating is substantially the only monomer decomposition process carried out.

Referring back to FIG. 1, because the pyrolytic CVD process does not require an electrically charged environment, the upper electrode 18 and lower electrode 20 in the deposition chamber are not electrically connected during the process, i.e., they are not powered or set at an electrical potential. The upper electrode 18 is accordingly not to be powered by the power source 30 and thus in the pyrolytic process the upper electrode 18 functions mainly to provide introduction of monomer gases to the pyrolytic environment. The lower electrode 20 likewise acts only as a support and cooling surface and is not connected to an electrical ground; the structure to be coated thereby is at a floating electrical potential. Given that a hot-filament is configured in the space between the two electrodes in the manner shown in FIG. 1, the electrodes serve to define a localized volume in which the monomer pyrolysis occurs. The support of a structure to be coated on the lower electrode thereby maintains the structure in the vicinity of the reactive species, such that deposition on the structure is favored.

The cooling system 26 configured in connection with the here unpowered lower electrode is controlled to maintain the structure temperature below that of the heat source to induce polymerization and deposition of the film on the structure surface. It is generally preferred that the temperature of the substrate or other structure surface be held sufficiently low to favor polymerization under the partial pressure of a given reactive species employed in the deposition process, as well as to avoid loss of the organic substituents from the silicon atoms in the film as the film is produced.

In accordance with the invention, the substrate or other structure to be coated with a silicone film is preferably configured on the lower electrode in a configuration that enables both effective cooling of the entire structure as well as effective deposition on the selected surfaces of the structure. The pyrolytic silicone film deposition techniques of the invention can be applied to a wide range of structures including complex three-dimensional geometries. Planar substrates, e.g., conventional microfabrication wafers such as silicon wafers, or other planar structures, can also be singly or batch processed. In a single-substrate process, the substrate can be simply supported on the lower electrode 20 in the manner shown in FIG. 1. In a multi-substrate process, a plurality of substrates can be suspended in the deposition chamber between the upper and lower electrodes by way of, e.g., an aluminum substrate boat, vertically supported by, e.g., a chamber sidewall anchor, and having support slots for holding substrates in a desired configuration. Preferably, the selected multi-substrate support configuration enables a user to adjust individual substrates' positions without substantial complexity; such substrate position adjustment may be desirable at intervals during a deposition process for enhancing deposition uniformity across the span of a substrate.

Deposition of a silicone film as provided by the invention can also be carried out on cylindrical objects such as thin cylindrical structures. For example, interconnection wires for integrated circuits, lead wires for pacemakers and other biomedical devices, and in general, any wiring structure for which a silicone coating is desired, can be coated by the deposition process provided by the invention. Importantly, because the structure to be coated is cooled during the deposition process, many wiring materials can be accommodated by the process. For example, single-stranded stainless steel or copper wire, or twisted groups wires such as twisted filler wires used in pace-maker leads, can be accommodated by the process.

In accordance with the invention a wire holder or other structure is provided for supporting wire on which a silicone coating is to be deposited in the deposition chamber. In one example configuration, the wire holder includes a holding ring, e.g., an aluminum ring, with a peripheral edge ridge. The holding ring and edge ridge geometry preferably correspond to the shape of the support surface of the lower electrode. With this geometry, the holding ring can be mated with the lower electrode. The holding ring can include posts, e.g., aluminum posts, at points around the circumference of the ring, for suspending a length of wire above the lower electrode; preferably, the wire is suspended about 0.5 cm above the lower electrode. A length of wire to be coated is accordingly wrapped one or more times between the posts at a point on the posts above the holding ring surface preferably such that all sides of the wire are accessible to the deposition conditions between the two electrode and the grounded electrode, and preferably such that no two or more windings or the wire are in contact. One or more screws or other fastening devices are preferably provided for fastening the length of wire onto the holding ring.

Multiple lengths of wire can be individually fastened to and supported by the holding ring configuration for simultaneous coating of the wires. During the coating process, the one or more lengths of wire can be rotated, but as will be recognized by those skilled in the art, such rotation is not required. Indeed, the nature of the deposition environment produced by the processes of the invention substantially entirely immerses the wires in the reactive species to be deposited. Rotation of the wires can be carried out for enhancing the uniformity of the wire coating. In one example rotation technique, the wires are rotated about their longitudinal axis, by, e.g., manually adjusting the wires. In a second example rotation technique, the wires are rotated around points in the deposition chamber. In this case, the holding ring can be configured, e.g., to spin like a record on a turntable such that portions of the wire lengths are periodically moved around the deposition chamber.

As will be recognized by those skilled in the art, various other support structures can be employed to accommodate a cylindrical object during the deposition process. For example, in the case of coating of a long continuous length of wire, take-off and take-up spools can be provided to enable a continuous coating operation. Here the spools are preferably controllable such that the wire length is drawn through the deposition atmosphere at selected intervals corresponding to a desired coating thickness, at a continuous rate, or other desired control scenario.

Structures having a geometry other than cylindrical and having a wide range of topology are also accommodated by the deposition process of the invention. For example, catheter inserts, neural probes, tubing, shaft structures, and other three-dimensional structures having multiple surfaces can be accommodated. For example, neural probe shaft structures like, e.g., iridium probes, having a cylindrical shaft that tapers to a tip, can be coated by the deposition process provided by the invention.

The invention provides a probe holder for supporting one or more probes during the deposition process. One example probe holder includes a PTFE block having one or more holes drilled in the block to a selected depth such that a probe can be supported in each hole. During the deposition process, the PTFE block is supported on the lower electrode in the deposition chamber; the hole depths are accordingly selected such that the probes are held a desired distance above the lower electrode. In an example process, the probes are preferably held about 1.0 cm above the lower electrode. Similarly, an array of PTFE support blocks, or a large block, can be provided on the lower electrode for deposition on a large number probes or other items during one deposition cycle. Furthermore, as can be recognized, there can be configured various deposition chamber conditions and access ports for enabling a continuous deposition process into and out of which items to be coated are introduced and removed in an assembly line fashion.

Heat sensitive materials, such as organic polymers like urethanes, can also be accommodated as substrates by the pyrolytic CVD process because the materials are cooled during the process. Polymer structures such as polymeric tubing, and other polymer structures can therefore be coated. The cooling conditions also enable coating of structures that include interfaces of two or more materials that characteristically interdiffuse, or that have different thermal expansion coefficients at relatively higher temperatures. Also, structures containing active biological components, such as enzymes, pharmaceuticals, or live cells, can be cooled to a suitably appropriate temperature that enables the deposition process while preserving the viability of the active components.

Other than polymer tubing, other tubing structures can be coated by the processes provided by the invention; the deposition processes are well-suited for coating thin-walled tubing, e.g., tubing having a wall thickness of between about $\frac{1}{128}$ inches and $\frac{1}{4}$ inches. In one example, a coating is deposited on the exterior of the tube structure along its length such that during use of the tube to carry gases or liquids, the gases and liquids cannot permeate through the tube wall. In one example deposition process, a length of tubing to be coated is slid over a corresponding length of wire, which in turn is supported on a holding ring. Preferably, the various considerations described above in connection with wire coating are also accounted for in this case. In a second example, one or more lengths of tubing are vertically suspended in the deposition chamber, without the need for an internal wire support. As will be recognized by those skilled in the art, other tubing support techniques are also suitable.

Other complex geometries, e.g., tubing having stabilizing fins, and other three-dimensional structures, can also be accommodated. As will be recognized by those skilled in the art, a support structure, e.g., a bulk PTFE block, or other support structure, can be employed to accommodate a specific object and desired object configuration. The only requirement of the support configuration is thermal conductivity sufficient to maintain a supported structure at a desired temperature that preferably is lower than the pyrolysis temperature. For example, a micro-ribbon cable to be coated with a silicone film can be first manually bent to form, e.g., a 90° angle. This can be accomplished, e.g., by placing the two ends of the cable in separate metal tubes or other connectors having dimensions similar to that of the ribbon. The tubes can be used to bend the ribbon and maintain the desired 90° curvature by positioning the tubes in corresponding holes in, e.g., a PTFE block. The cable is then maintained in its bent position during the deposition process by the tubes in the block. In addition, reorientation of the object to be coated and its support structure can be enabled by, e.g., manual reorientation during the deposition process, or like the spinning wire holder ring described above, can be designed-in as a mechanism integral to the support structure. Substrate and object reorientation techniques, as are routinely employed in industrial vapor deposition and ion-implantation processes, can correspondingly be employed in the invention to enhance deposition uniformity.

A very wide range of monomers can be employed in the pyrolytic CVD process of the invention, preferably including, e.g., the class of materials generally known as organosilicon compounds. In general, the selected monomer preferably contains a ring of alternating silicon and oxygen atoms in which the silicon is also bonded to hydrocarbon or fluorocarbon groups; but as can be recognized, this is not required. Silanes, siloxanes and specifically cyclic polysiloxanes, substituted siloxanes, spirocyclic polysiloxanes, and other such compounds can be employed. Some specific monomers well-suited for the pyrolytic process include hexamethylcyclotrisiloxane, known as $[(CH_3)_2SiO]_3$ or $D_3$; and octamethylcyclotetrasiloxane, known as $[(CH_3)_2SiO]_4$ or $D_4$. Other suitable monomers include $[(CF_3)_2SiO]_3$, $[(CF_3)_2SiO]_4$, $[(C_6H_5)_2SiO]_3$, $[(C_6H_5)_2SiO]_4$, $[(C_6H_5)_2SiO]_3$, $[(C_6H_5)_2SiO]_4$, $[(C_2H_3)_2SiO]_3$, and $[(C_2H_3)_2SiO]_4$.

Appendix A lists a large number of other monomers contemplated by the invention for use in the pyrolytic silicone chemical vapor deposition process. This list is illustrative of the wide range of monomers contemplated and is accordingly not meant to be limiting. Admixed feed gases such as argon and/or oxygen can be included with the monomer gas, if desired, to dilute the monomer or to assist in tailoring the properties of the film for a given application.

In carrying out the pyrolytic chemical vapor deposition process, the structure to be coated is first configured on the lower electrode, here used as a lower support and thermal conductor, and the cooling loop is engaged to control the lower electrode and structure temperature. The structure temperature is preferably maintained at a temperature less than, e.g., about 175° C., which enables effective growth, e.g., a temperature greater than about −15° C.

Given that a hot-filament is configured at the location of the upper electrode and that the monomer gas is introduced through a showerhead configuration in the upper electrode, then the upper and lower electrode spacing defines the local vicinity of the pyrolytic process; accordingly the gap between the electrodes is preferably set to a distance that does not inhibit absorption and growth of the polymer on the structure. For example, for deposition on a substrate, a gap of between about 5 mm and about 3 cm is typically suitable, depending on the substrate topology. The appropriate gap spacing for nonplanar, three-dimensional structures can be empirically optimized The deposition chamber is pumped down to a suitable pressure, e.g., to a pressure of between about 0.01 Torr and about 2 Torr. The pyrolysis surface, e.g., a hot-filament, is then heated by directing a dc voltage to the filament in the manner described above. The filament temperature is preferably set at between about 200° C. and about 850° C., but can be set at any suitable temperature which enables pyrolysis but that does not cause thermionic emission from the filament. Once steady-state chamber pressure, structure temperature, and filament temperature conditions are established, the precursor monomer gas flow to the chamber is established. A gas flow of between 0 sccm and about 30 sccm is typically suitable. The gas flow and the established chamber conditions are then maintained to produce a film of selected thickness. During the deposition process, the partial pressure of the reactive species is preferably kept to a low level that prevents homogeneous gas-phase reactions, which could cause particle production in the gaseous environment rather than on the structure to be coated.

Whatever process parameters are selected, an initial adhesion-promotion step can be employed prior to the deposition process to enhance and promote adhesion of the depositing species on a given structure. For example, an adhesion promoter can be spin-applied to a planar substrate or sprayed on to a complex geometrical object. Alternatively, an adhesion promoter can be vapor-deposited in situ in the deposition chamber just prior to the silicone film deposition process. Examples of suitable adhesion promoters include 1H, 1H, 2H, 2H-Perfluorodecyltriethoxysilane; 1H, 1H, 2H, 2H-Perfluorooctyltriethoxysilane; 1H, 1H, 2H, 2H-Perfluoroalkyltriethoxysilane; perfluorooctyltriclorosilane; all classes of vinyl silanes, as well as other adhesion promoters, as will be recognized by those skilled in the art In addition to pre-deposition processes, a wide range of post-deposition processes can be carried out in situ in the deposition chamber. For example, a post-deposition annealing in air, or in nitrogen or other inert gas, can be employed for, e.g., film stress relief, surface passivation, thermal stability enhancement, or other condition. Annealing can be carried out at a temperature of, e.g., between about 50° C. and about 400° C.

EXAMPLE 1

A silicone thin film was produced in accordance with the pyrolytic CVD process of the invention by vaporizing about 2 sccm of octamethylcyclotetrasiloxane, or $D_4$, from a Pyrex sample container into a deposition chamber like that described above, maintained at a pressure of about 0.6 Torr. A hot-filament tantalum wire of about I mm in diameter was positioned under the upper showerhead. Using resistive heating by a dc voltage, the hot-filament was maintained at a temperature of about 415° C. ±5° C. A water cooling configuration was employed to maintain the lower electrode at a temperature of about 20° C. ±3° C. A silicon wafer of about 2 inches in diameter was supplied on the cooled electrode for depositing a silicone film on the wafer. A thermocouple positioned on the backside of the wafer was employed to monitor wafer temperature and verify that it remained in the stated range. The separation between the filament and the wafer on the lower electrode was about 11 mm. The pyrolytic CVD process was carried out to produce a film of about 6.9 $\mu$m in thickness.

Figure 5A:
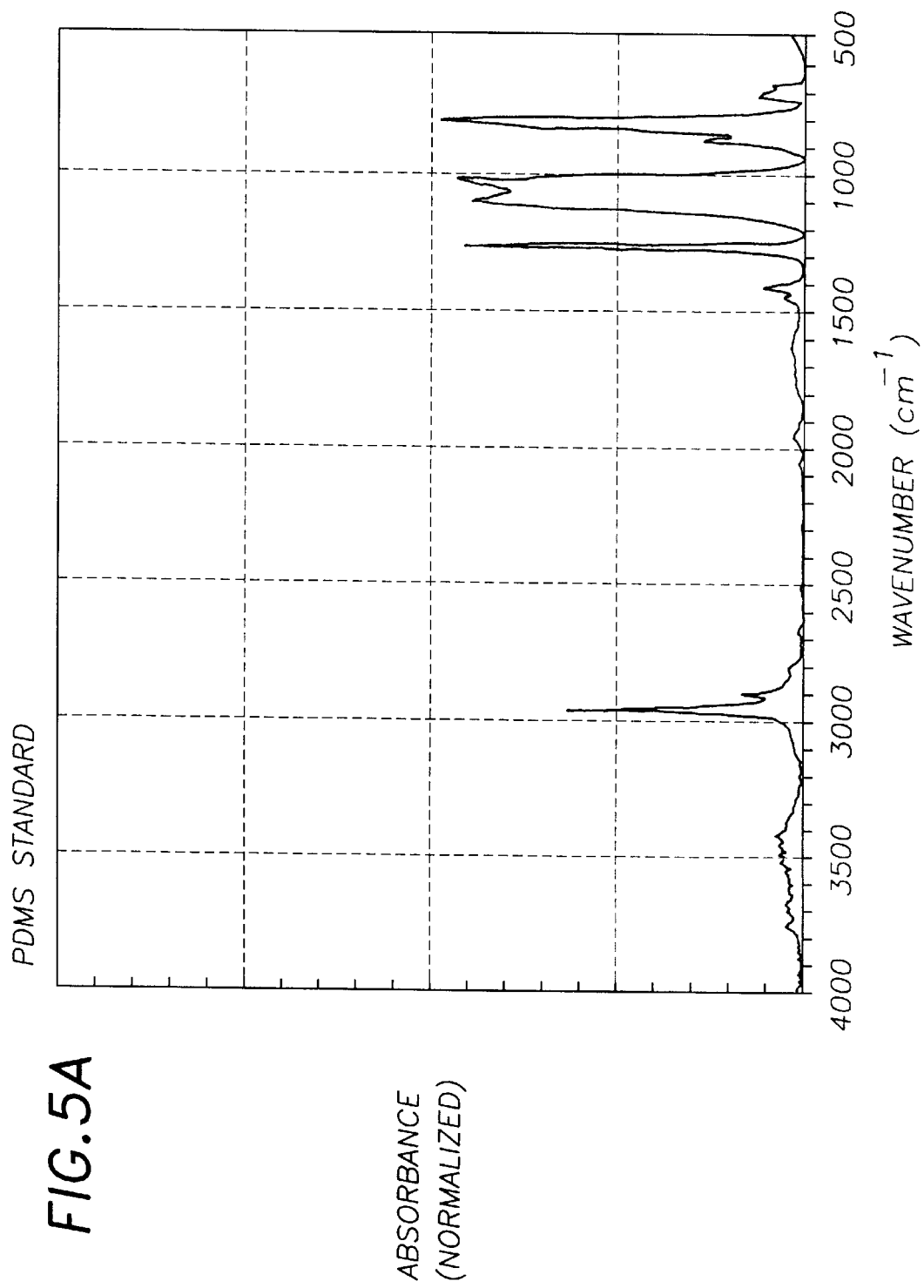
FIG. 5A is a Fourier transform infrared spectroscopy spectrum for a liquid silicone secondary standard, poly (dimethylsiloxane), known as PDMS.
Figure 5B:
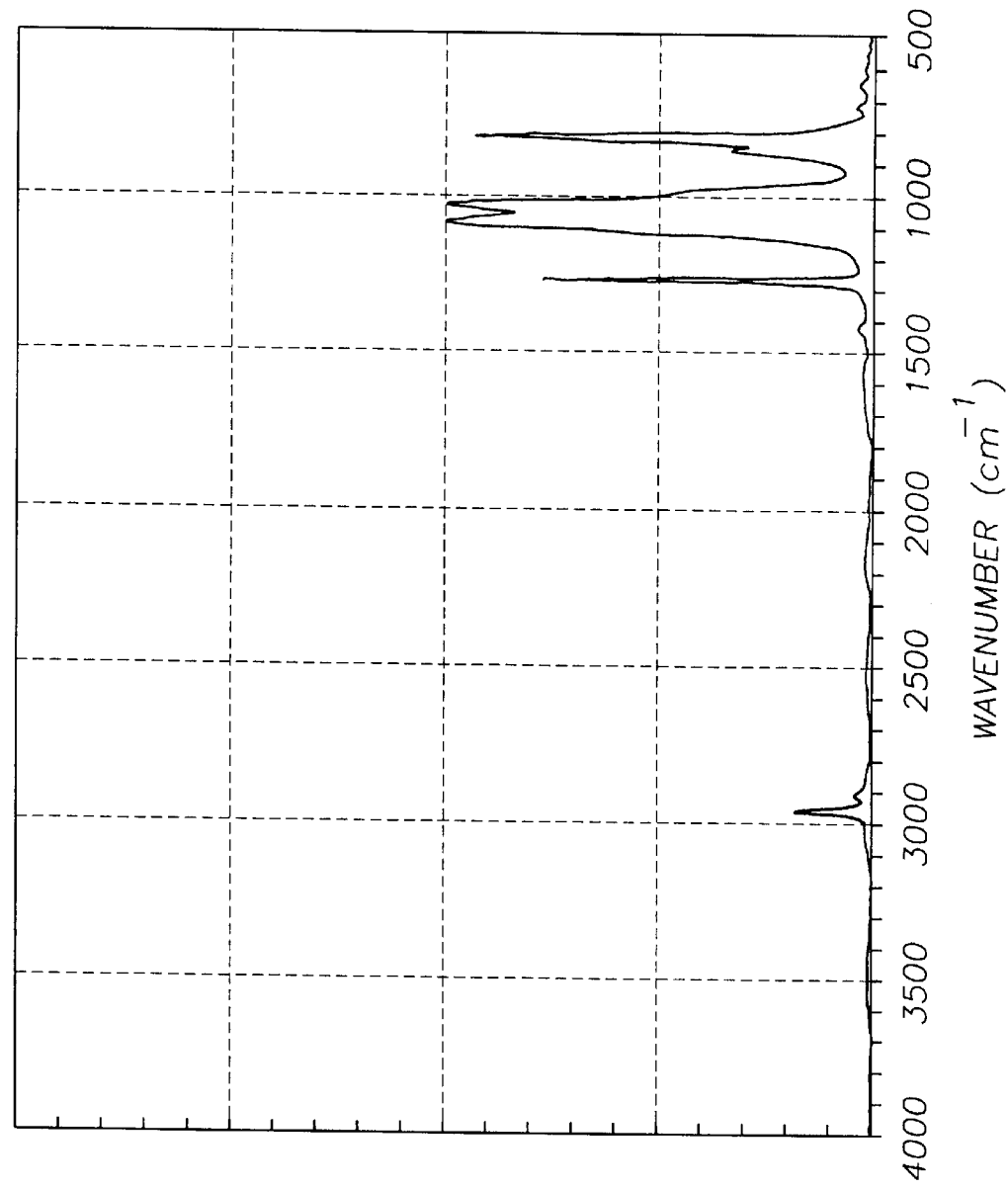
FIG. 5B is a Fourier transform infrared spectroscopy spectrum for a silicone film produced in accordance with the invention.

FIGS. 5A and 5B are spectra from Fourier transform infrared spectroscopy of a viscous liquid silicone secondary standard and of the produced film, respectively. The silicone secondary standard was poly(dimethylsiloxane), known as PDMS, and was from Aldrich Chemical, Inc. A qualitative analysis of the spectra indicates that the film produced in accordance with the invention and the secondary standard have absorbance peaks at identical wavelengths and hence have identical IR active functional groups.

X-ray photoelectron spectroscopy of the produced film was also conducted to determine the relative elemental composition of the film, By assuming that the PDMS standard has the ideal elemental composition of $C_2SiO$ and adjusting the instrument sensitivity factors for the 0 1s, C 1s, and Si 2p peaks to reflect this, the composition of the produced film was determined to be $C_{1.53}Si_{1.00}O_{1.00}$. This 1:1 Si:O ratio indicates that the Si-O backbone of the polymer is left intact by the pyrolytic CVD process.

EXAMPLE 2

Nuclear magnetic resonance spectrometry with a $^{29}$Si resonance frequency of 53.64 MHz was used to probe the chemical nature of the silicon nuclei in films produced under the pyrolytic CVD conditions of the invention, through cross-polarization/magic-angle spinning solid state 29Si NMR. Two silicone films were produced on separate silicon substrates in the manner described above. The deposition pressure was maintained at about 0.6 Torr, the tantalum hot-filament power was maintained at about 120 W, the filament-to-wafer distance was about 10.5 mm, and the substrates were maintained at a temperature of about 20° C. ±3° C., verified by a thermocouple measurement. The deposition process was carried out for about 2 hours in order to accumulate sufficient material for analysis. Approximately 60 milligrams of material was scraped off of the silicon wafers, mixed with alumina as a filler, and packed into a rotor, which was spun at about 3.5 kHz.

Figure 6:
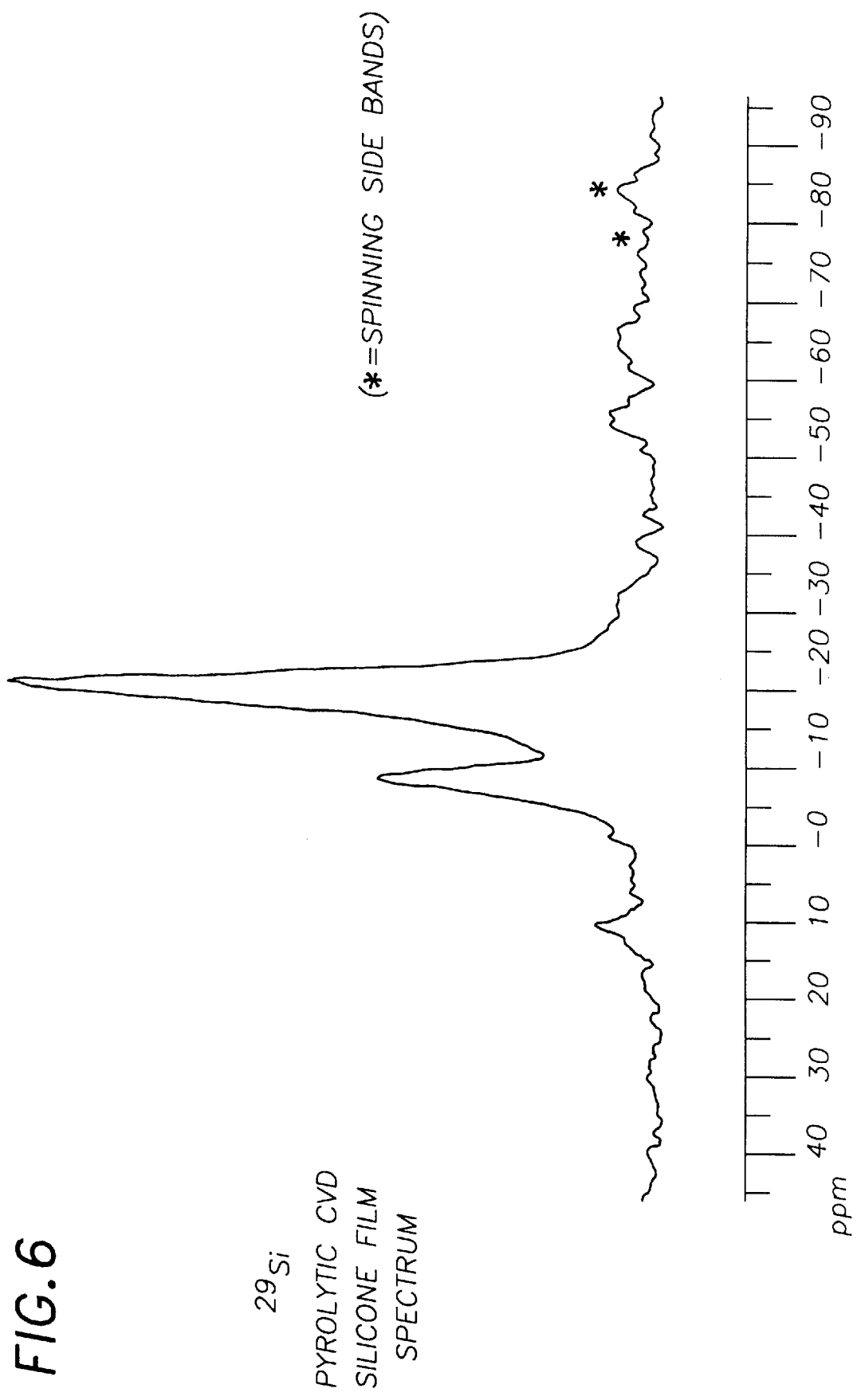
FIG. 6 is a $^{29}$Si nuclear magnetic resonance spectroscopy spectrum for a silicone film produced in accordance with the invention.

FIG. 6 is the resulting spectrum collected in a Chemagnetics 7.5 mm, double resonance, magic angle spinning probe using a 7 $\mu$sec, 90° pulse followed by 3 msec cross polarization contact time. A total of 512 signal averages with a 20 $\mu$sec dwell time and a 20 sec recycle delay were used. Note that with this indirect excitation technique, unlike direct excitation NMR techniques, the area under the peaks of the cross-polarization spectra cannot be directly compared to give quantitative relative concentration information.

Figure 7:
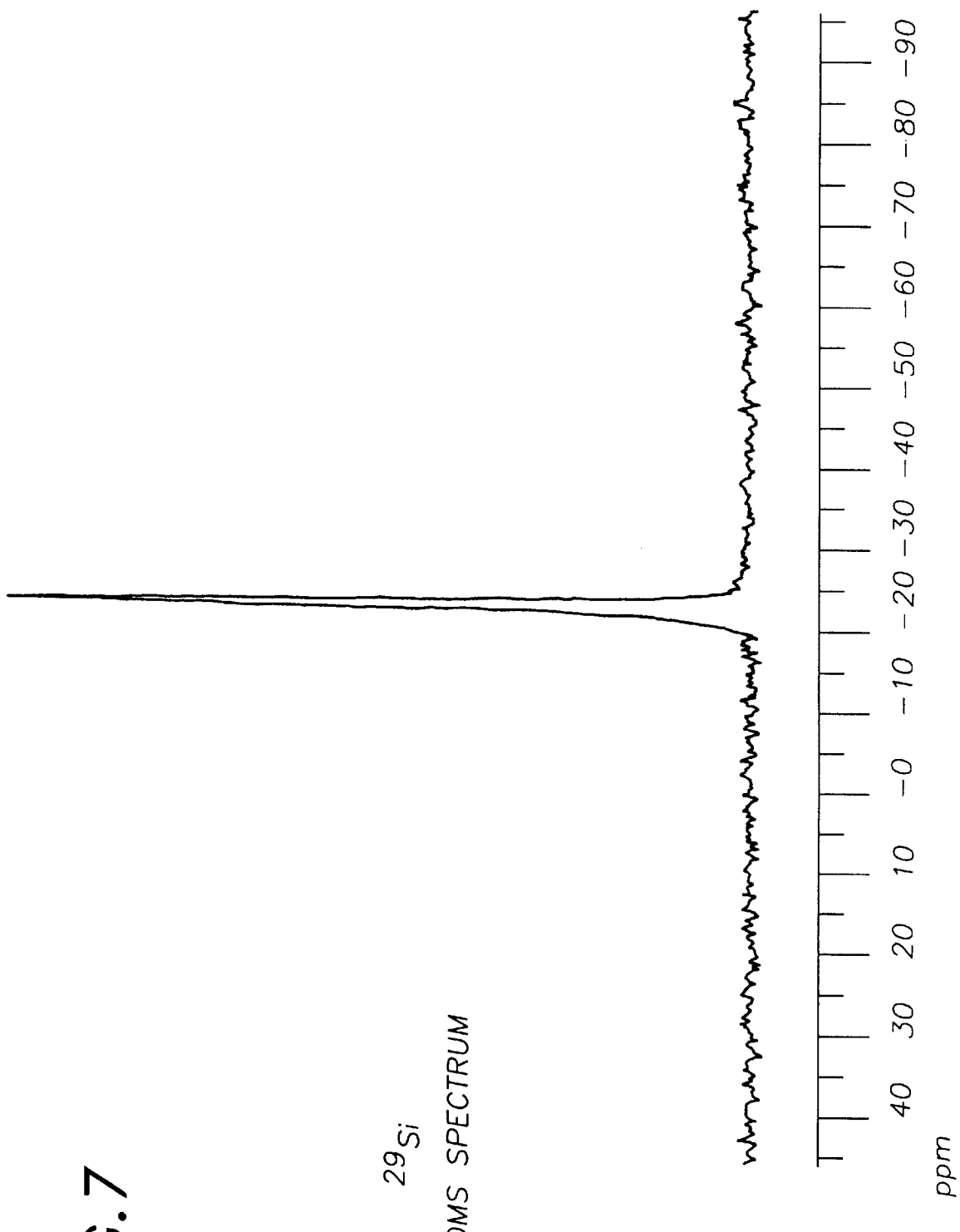
FIG. 7 is a $^{29}$Si nuclear magnetic resonance spectroscopy spectrum for a liquid silicone secondary standard, poly (dimethylsiloxane), known as PDMS.
Figure 8:
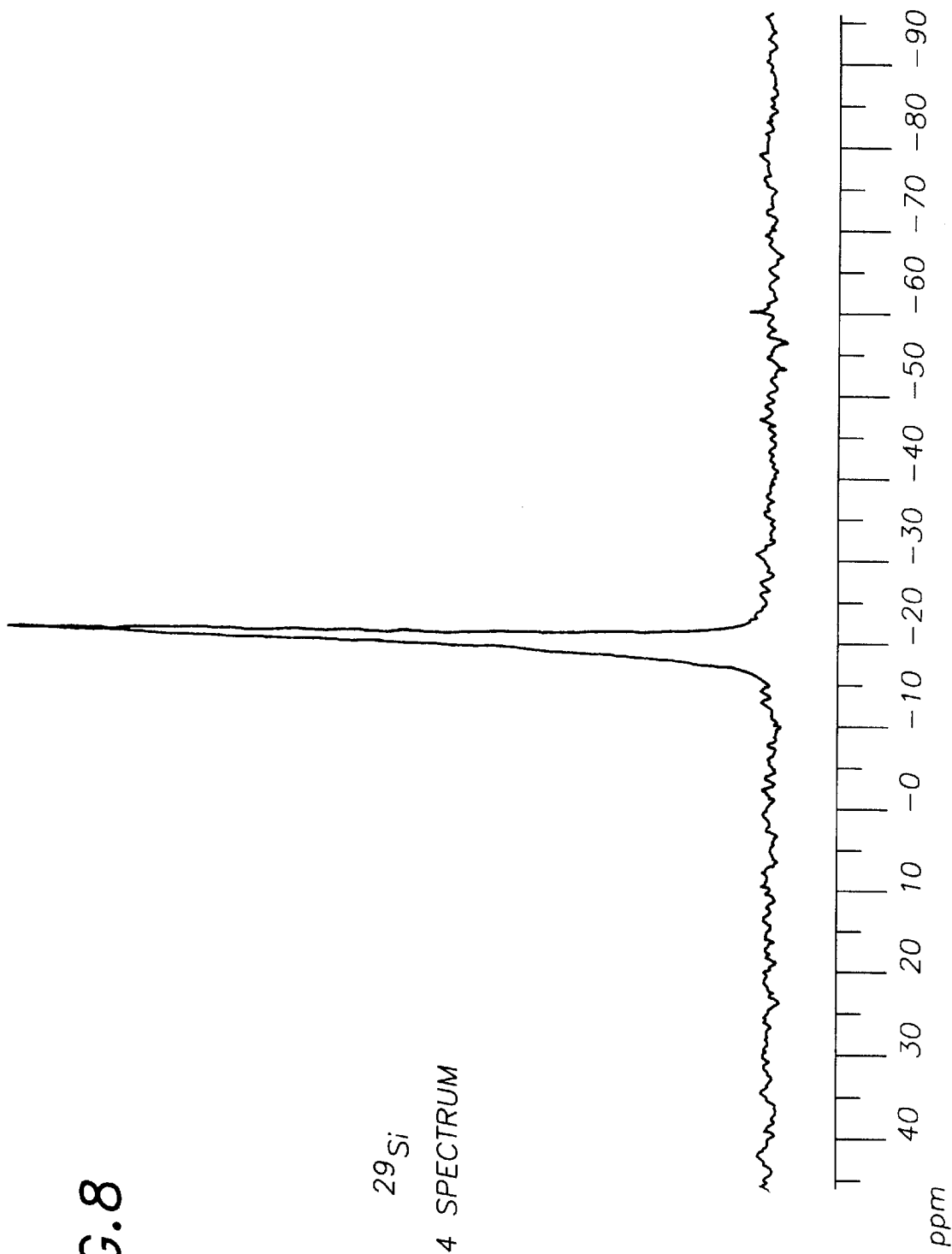
FIG. 8 is a $^{29}$Si nuclear magnetic resonance spectroscopy spectrum for pure octamethylcyclotetrasiloxane, known as or $D_4$.

FIG. 7 is the corresponding spectra produced for the PDMS secondary standard described in Example 1, and FIG. 8 is the corresponding spectra produced for pure $D_4$. The two main peaks in the spectrum for the pyrolytic CVD film, as shown in FIG. 6, occur at about −8 ppm and about −19 ppm. The peak at −19 ppm corresponds to the Si in a dimethylsiloxane unit. As can be seen in the spectra for the PDMS standard, FIG. 7. and the spectra for pure $D_4$, FIG. 8, this peak can shift from between about −18 ppm and about −23 ppm. An overall comparison of the spectra indicate that compared with the PDMS standard and pure $D_4$, the pyrolytic CVD film provided by the invention includes just one other bonding environment that can be distinguished by NMR.

The −8 ppm peak in the pyrolytic CVD film spectra is due to Si—Si crosslinks, which are not present in bulk silicone material such as PDMS or in plasma polymerized silicon films. Such Si—Si bonds are found to impart improved mechanical properties to the films of the invention over that of the plasma polymerized films. This in turn eliminates the need for incorporation of fillers or crosslinking agents as is conventional for bulk silicones. In addition, it is found that the Si—Si bond structure can be photosensitive, rendering the films of the invention well-suited as photolithographic photoresists, *as described in detail below.*

Figure 9:
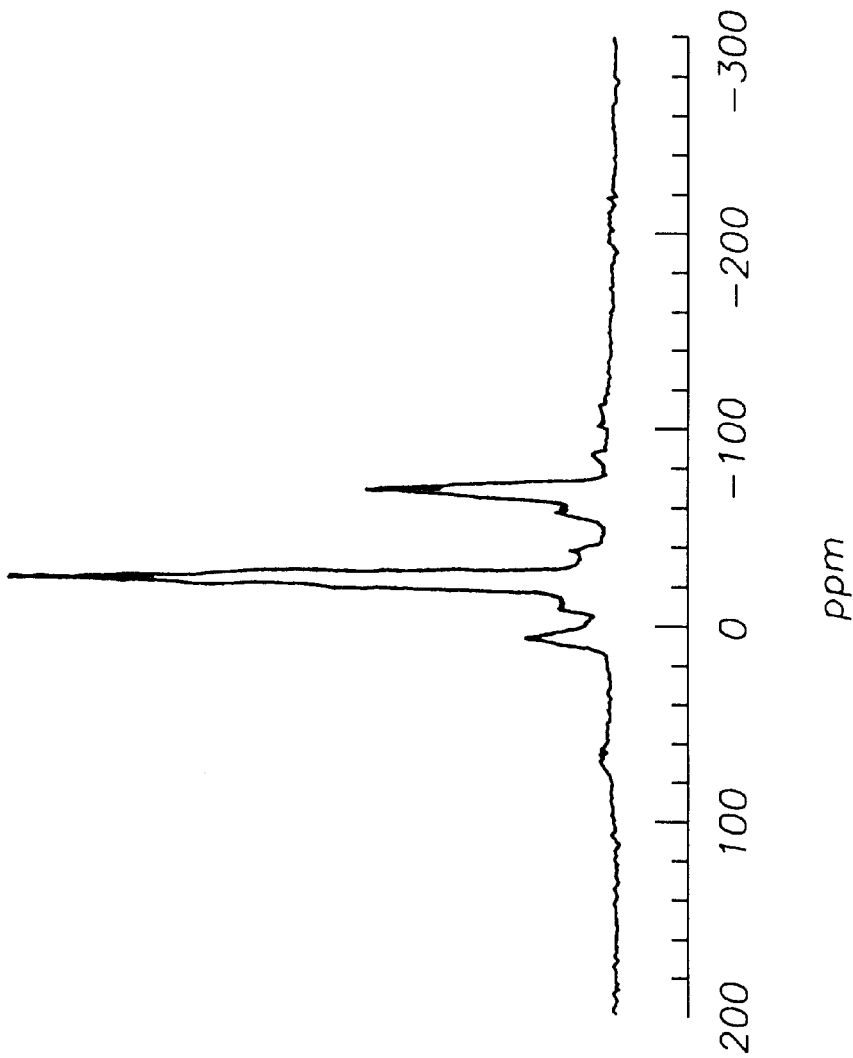
FIG. 9 is a $^{29}$Si nuclear magnetic resonance spectroscopy spectrum for a silicone film produced by a prior art process.

FIG. 9 is the $^{29}$Si NMR spectrum for a film produced by a prior art deposition process, namely, a plasma chemical vapor deposition technique, employing $D_4$ as the monomer. This spectrum was taken from Tajima et al., *J Polym. Sci. Polym. Chem.*, V. 25, pp. 1737, 1987. Comparison of this spectrum and the spectrum of FIG. 4 for the pyrolytic CVD film of the invention clearly indicates that the two film compositions are different, even though the two processes employed the same precursor. In the Tajima process, an aluminum bell-jar type deposition chamber was employed; the system was evacuated to a pressure of 0.13 Pa. A plasma environment was produced by a 13.56 MHz rf generator, with an input power of 100 W. The resulting film was collected on the inside wall of the chamber and was scraped off for analysis.

Note in this spectrum for the PECVD film two significant peaks at about 10 ppm and about −60 ppm, corresponding to $(CH_3)_3Si—O—$ and $(CH_3)Si—(O)_3$ groups, respectively. Although both of these groups are found in the pyrolytic CVD film, they are at barely detectable levels.

It has been found that the ability to deposit relatively thick silicone films by PECVD techniques has been limited by cracking of the films above some maximum film thickness, typically about 1 $\mu$m in thickness. This may be due to the $SiO_3$ moieties of the PECVD film, as indicated by the NMR results for the PECVD film. The pyrolytic CVD film of the invention is devoid of these moieties, thereby enabling the production of relatively thick, crack-free silicone films.

Oxided materials like conventional PECVD silicone films are understood to be less photosensitive than the pyrolytic CVD films of the invention, and are further understood to be more likely to undergo complete oxidation to $SiO_4$ units with age, i.e., conventional PECVD films are much less compositionally stable than the pyrolytic CVD films of the invention.

Without being bound to theory, it is understood that the pyrolytic CVD process of $S^{2+}$ the invention allows for only Si oxidation states, as indicted by both the XPS and NMR spectra above. In great contrast, $Si^{3+}$ and $Si^{4+}$ oxidation states are present in the PECVD films of the prior art. These higher oxidation states result in films of increased stress, leading to film cracking at even relatively thin films, and of reduced photosensitivity, a characteristic that is important for photolithography applications.

As indicated by these examples, the similarity in structure of the pyrolytic CVD films of the invention with the PDMS standard film verifies the recognition provided by the invention that the electron impact and ion bombardment events in a plasma CVD process are not required for CVD production of a silicone film. It is found that the pyrolytic CVD silicone films of the invention differ in structure from both bulk PDMS and conventional PECVD silicone films; specifically, pyrolytic films of the invention are distinct in their the inclusion of regions of PDMS chains that are cross-linked by Si—Si bonds. This configuration results in mechanical toughness of the films without cracking of films. In addition, in contrast to conventional PECVD silicone films, the only oxidation state present in the pyrolytic silicone films is $Si^{2+}$. This condition improves the films' resistance to atmospheric aging as well as imparting a high photosensitivity to the film.

A further advantage of the silicone pyrolytic CVD process of the invention is found to be high film deposition rates relative to that typical of PECVD processes. The deposition rate of conventional silicone PECVD processes have generally been reported to be less than about 1 $\mu$m/min, and at most about 1.6 $\mu$m/min. In great contrast, the pyrolytic CVD process conditions enable a silicone film deposition rate of as high as about 2.5 $\mu$m/min or higher. This high deposition rate is for many applications critically important to enable practical deposition times in, e.g., a manufacturing environment.

The invention provides a further class of silicone deposition techniques, this class being hybrid PECVD/pyrolytic CVD deposition processes designed for customizing materials properties of a film in situ during the film deposition process. In a first example of such a process in accordance with the invention, two or more deposition intervals are defined, each interval employing one or both PECVD and pyrolytic thermal-CVD conditions. For example, during a first deposition interval, one of continuous or pulsed plasma CVD conditions are provided; then during a growth phase interval, pyrolytic CVD conditions alone or in combination with PECVD conditions are provided; followed by a final interval during which continuous or pulsed plasma CVD conditions are provided.

Processes such as this example three-interval process provide several advantages. 20 First, it is recognized that ion bombardment aids in initiation of deposition of gas species onto a substrate or other structure, due, e.g., to the electric field bias inherent in the plasma excitation conditions. This in turn enhances the adhesion of the depositing film to the underlying substrate or structural surface. Thus, the ion, neutral, and free radical production provided by a plasma process can be advantageously employed at the start of the deposition to aid in film nucleation and to enhance film adhesion. The film surface roughness characteristic of PECVD deposition conditions also aids in adhesion.

During a sequential growth phase, the plasma is extinguished and the pyrolysis of the monomer is commenced, whereby only thermal processes produce the reactive gas species that polymerize on the surface of the substrate or structure.

During the thermal-CVD growth interval, the properties of the film can be further customized. For example, a plasma can be ignited for one or more brief sub-intervals to enhance crosslinking, or to otherwise modify the film characteristics in a depth-dependent manner. Alternatively, a relatively low-power plasma can be maintained during either the entire duration or a portion of the growth interval duration; results similar to that produced by the sub-interval plasma sequence are here achieved as a result of the correspondingly relative low level of ions. As in the initiation interval, either continuous- or pulsed-PECVD can be employed in either alternative. The incorporation of a low-power plasma during the pyrolytic CVD process can be beneficial for biomedical applications where UV bombardment of a structure to be coated and a film as it is grown aids in maintenance of a sterile environment during the film growth.

During a final deposition process interval, in one example scenario, plasma conditions are provided until the end of the deposition cycle. This results in a deposited top-coat surface topology that generally enhances the adhesion of a second film material to be subsequently deposited on the silicone film. In this final deposition process interval, the feed gas composition can also be selected to enhance film surface adhesion characteristics. For example, oxygen and/or silicon-bearing gases can be added to the feed gas composition to produce a film surface having topological and chemical properties that are conducive to adhesion as well as providing, e.g., chemical stability such as oxidation resistance.

The three-interval deposition process just described is but one example of a wide range of process variations contemplated by the invention. As will be recognized by those skilled in the art, other combinations of pyrolytic CVD and PECVD conditions can be employed to achieve customization of a silicone film as the film is deposited. The degree of crosslinking, density of dangling bonds, and other characteristics desired for a given film can be controlled by way of the pyrolytic CVD and PECVD process combinations. Deposition rate can also be controlled by PECVD and pyrolytic CVD combinations; for example, deposition rate can be increased by providing PECVD and pyrolytic CVD conditions simultaneously.

Whatever sequential or simultaneous conditions are employed, they preferably are selected based on the requirements of a film for a given application. For example, a three-interval process of PECVD, pyrolytic CVD, and then PECVD conditions can be employed to produce a graded interface between an underlying substrate or layer, a silicone film having properties characteristic of pyrolytic CVD conditions, and an overlying layer. This enables customization of the lower and upper interfaces to accommodate varying mechanical and chemical conditions. As will be recognized by those skilled in the art, many other film configurations can be addressed by the combination processes provided by the invention.

The example deposition chamber described above and shown schematically in FIG. 1 provides a configuration that enables alternating and simultaneous PECVD and pyrolytic CVD process conditions. During active PECVD intervals, the chamber pressure can be adjusted, but for many processes the chamber pressure for the pyrolytic CVD process conditions, between about 0.01 and about 2 Torr, is adequate. Similarly, the flow rate of the precursors and any additional feed gases can be adjusted for a PECVD interval. but for many applications the flow for pyrolytic intervals of between 0 and about 30 sccm is adequate. Argon, oxygen, ammonia, or other suitable feed gas can be added with the monomer species during the PECVD process intervals. The temperature of the structure on which the silicone film is to be deposited is preferably controlled during both the pyrolytic and PECVD process intervals, using, e.g., the water cooling system of FIG. 1. A structure temperature of between about −15° C. and about 175° C. is preferable. The plasma excitation can be provided as RF excitation, as in the configuration of FIG. 1, or by any other suitable excitation mechanism, e.g., capacitive coupling of electrode plates. The structure onto which the silicone coating is being deposited is to be held at an electrical potential of between about −400 V to about +400 V, including a ground potential or floating potential, during the plasma process intervals. Ground potential or floating potential are preferred. The lower electrode on which the structure is supported is accordingly set at the corresponding potential during the plasma deposition intervals, e.g., by grounding the electrode in the configuration shown in FIG. 1.

As explained above, both continuous plasma and pulsed plasma excitation mechanisms can be employed for the PECVD process intervals. Under continuous PECVD conditions, the RF or other plasma excitation mechanism is maintained substantially constant during the PECVD interval. Under pulsed-PECVD deposition conditions, in accordance with the invention, the RF or other plasma excitation, applied to the feed gas introduced into the chamber, is pulsed over time. In other words, the RF excitation power is alternately turned on and off following a selected duty cycle, rather than being applied as a continuous plasma excitation. This pulsed-plasma excitation technique enables a much wider range of process control than is typical of continuous-plasma deposition processes and thus may be preferable for some applications in which fine tailoring of film properties is desired. In the invention, the plasma excitation on-time is between 0 and about 1 sec, and the plasma excitation off-time is between 0 and about 10 secs. Preferably, the plasma excitation on-time is less than about 100 milliseconds and the plasma excitation off-time is less than about 1000 milliseconds.

During the plasma excitation on-time, the electron and ion interactions characteristic of a plasma, as described above, result in an electrically-charged reactive precursor environment in the deposition chamber. During the plasma excitation off-time, no additional charged particles or reactive neutral species are produced, and the ions produced during the on-time decay more quickly than the reactive neutral species produced during the on-time. As a result, during the on-time, reactive species deposit and polymerize on the structure and ions bombard the structure, along with UV irradiation of the structure, while during the off-time, no significant ion bombardment occurs. If pulsed PECVD and pyrolytic conditions are maintained simultaneously, the pyrolysis process provides the continuous production of reactive but uncharged, neutral species during the entire cycle, even during the plasma excitation off-time.

As is well-recognized, PECVD processes fundamentally consist of a competing deposition ablation processes as a result of ion bombardment during the deposition. It has been found that with the pulsed-PECVD process of the invention, reasonable film deposition rates are maintained even at small plasma excitation on/off-time ratios. This indicates that the reactive neutral species produced during the plasma excitation on-time of each pulse duty cycle likely survive sufficiently long during the off-time of the pulse duty cycle such that the film growth reaction favors deposition during this time. Thus, the pulsed-PECVD process reduces the degree of ion bombardment of a structure being coated while substantially maintaining reasonable deposition rates.

Considering applications of the silicone films which can be produced in accordance with the invention, there can be deposited a conformal silicone coating on a geometrically-complicated three-dimensional structure having sub-micron features. As described above, wires, probes, microribbons, implantable devices such as biomedical devices, and other such structures can be effectively coated by the processes of the invention. For example, a complete neurological electrode assembly, including probes, bond areas, electrical leads, and other components can be coated by the process of the invention. Complicated interconnections such as inter-digitated conducting tracks and microribbon arrays can similarly be coated. The wide range of structures described above in connection with support of structure configurations on a lower electrode during the deposition process are further contemplated.

Silicone films produced in accordance with the invention can further be employed as protective coatings on optical devices and as quasisubstrates for the fabrication of optical components such as light guides. Silicone films can further be employed in the fabrication of permselective gas separation membranes. The silicone films produced in accordance with the invention can further be employed as dielectric materials in semiconductor device fabrication processes. For example, the interlayer dielectric fabrication process described by Gleason et al., in U.S. Pat. No. 5,888,591, issued Mar. 30, 1999, entitled "Chemical Vapor Deposition of Fluorocarbon Polymer Thin Films," the entirety of which is hereby incorporated by reference, can also be addressed by the silicone films of the invention.

One important application enabled by the invention is the use of the pyrolytic CVD film of the invention as a CVD photoresist film for photolithography processes in semiconductor microfabrication. In such an application, the pyrolytic CVD film can replace conventional liquid photoresists. Conventional photoresist materials are applied to a microfabrication wafer by a liquid spin-on coating process. In this process, typically only a few percent of the material dispensed onto the wafer actually is maintained on the wafer to form a photoresist layer; the remaining material is removed. The resulting waste solution contains, e.g., the polymeric material, photosensitive agent, and solvents, and can be volatile to combustion, as well as unsafe for operator handling. Based on these and other considerations, liquid spin-on photoresists are thus generally considered to be suboptimal.

In accordance with the invention, a pyrolytic CVD film produced under the process conditions of the invention described above can be employed as a "dry" photoresist film that is substituted for a conventional liquid spin-on photoresist. Correspondingly, the invention provides a photolithographic process sequence that employs a "dry" plasma etch pattern transfer step in substitution for the conventional wet development step employed with spin-on photoresists. This enables elimination of the environmental hazards associated with conventional liquid photoresist processing, as well as improved process efficiency and performance.

In accordance with the invention, a pyrolytic CVD film is deposited on, e.g., a silicon wafer, or other substrate, on which photolithography is to be carried out. The resulting photoresist layer is preferably of sufficient thickness to cover the wafer surface topology and withstand subsequent processing steps, but thin enough to permit patterning of submicron-scale features. This enables formation of a dry photoresist on a wide range of substrates including those having dimensions that are not amenable to conventional spin-on liquid photoresist films. A hybrid PECVD/pyrolytic CVD deposition sequence can be carried out, as described above, to improve adhesion properties of the film on the wafer, and to tailor the oxidized state of the film through the film thickness.

After deposition of the photoresist film, the film is exposed to patterning radiation to photooxidize and crosslink selected regions of the film. Such radiation can be supplied by a laser, electron beam, ion beam, or other suitable radiation source. Focused-beam sources can be employed to directly "write" a desired pattern on the photoresist film, while broad-beam sources can be employed to project a broad radiation exposure field through an optical mask including a pattern of transparent areas and opaque areas situated to form a desired pattern. A typical mask for optical lithography is formed, e.g., of a quartz plate on which chrome is patterned using an electron beam source and conventional, spin-applied photoresist. A stencil mask can be used for projection lithography employing an e-beam or ion-beam.

The exposure radiation is preferably of a wavelength that is substantially absorbed in the upper surface region of the photoresist layer, and is preferably applied in a total dose sufficient to crosslink exposed surface regions to a degree that is effective in preventing etching of those regions during a subsequent plasma etch step. For example, radiation at about 193 nm can be employed. As will be recognized by those skilled in the art, a wide range of exposure tools, e.g., an excimer laser, and a wide range of exposure wavelengths can be successfully employed with the pyrolytic CVD photoresist of the invention. Indeed, any exposure source that can effectively crosslink or photooxidize the photoresist to produce a selective etch barrier is contemplated by the invention. For example, radiation at 248 nm, 157 nm, 126 nm, 13 nm or other radiation in the EUV range, and conventional short-wavelength X-rays are all candidates for exposure radiation. Radiation at the i-line, i.e., 365 nm, as well as other ranges of radiation are also suitable. Alternate sources, e.g., ion beam, electron beam, or other exposure mechanisms are further contemplated. A very high radiation level can be employed to actually ablate regions of the photoresist film that are exposed to the radiation. This scenario can result in a self-developing, positive tone photolithographic process, i.e., a process that does not require a separate development step.

After irradiation of the photoresist film to photooxidize selected regions of the film, the desired pattern is then transferred to the film. This is accomplished by, e.g., exposing the resist to an oxygen-containing plasma in a conventional reactive ion etching system. The oxygen plasma reacts with the regions of the film that were not photooxidized, and etches those regions, whereby they are removed. In contrast, the photooxidized regions, having a composition very close to that of silicon dioxide, are not etched. As a result, the photooxidized photoresist regions remain after the plasma step and result in a photoresist pattern on the substrate Any suitable etching system, e.g., a range of plasma etching systems and plasma chemistries, can be used to accomplish the pattern transfer; as will be recognized by those skilled in the art, a photoresist film can be tailored, to some extent, to a particularly selected etching system. In general, however, only a high-ion-density source can produce etch residue-free, anisotropic photoresist patterns using an oxygen plasma alone.

Depending on the desired selectivity, the plasma etch source power can range between, e.g., about 1000 W–2500 W, the chuck power can range between, e.g., about 10 W–200 W, the pressure can range between about 0.5 mTorr–5 mTorr, the temperature can range between about −100° C.–25° C., and the oxygen flow rate can vary between, e.g., about 10 sccm to 200 sccm. In other etch process variations, etch species other than oxygen can be incorporated, e.g., $Cl_2$, HBr, $SO_2$, or $N_2$. Aside from a parallel plate etch system, an inductively-coupled plasma system (ICP) or a transformer-coupled plasma system (TCP) can alternatively be employed. If speed of single-wafer processing is a concern for a production environment, then an advanced RIE system is required; higher etch rates can be achieved in such advanced systems.

At the completion of the dry plasma etch development step, the areas of the photoresist film that were not photooxidized by the radiation exposure are removed, and there remains only those areas that were photooxidized. These remaining areas, which in composition approach that of silicon dioxide, then can be employed as a mask for subsequent fabrication processing steps such as dopant diffusion or etch steps.

As can be recognized, a wide range of dry-development processes like the oxygen plasma etch process above as well as other development processes can be employed to pattern the radiated silicone film. For example, a supercritical $CO_2$ development process, a more conventional solvent-based development process, or other development technique can be employed.

In accordance with the invention all of the photolithographic processing steps can be carried out in a single chamber environment or chamber cluster. Such an arrangement enables a photolithographic sequence in which a wafer is maintained in a chamber environment during the entire sequence, and not exposed to ambient atmosphere between steps. This has particular advantages for wafer materials that are prone to oxidation or contamination or that do not lend themselves to manual handling. By eliminating the need for liquid photoresist spin-coating or liquid developing photolithographic steps, the invention enables such a closed processing environment. As can be recognized, a chamber cluster configuration can be employed in a multi-step fabrication sequence that includes the photolithographic process of the invention, whereby all of the steps of the fabrication sequence, including the photolithographic steps, are carried out in-vacu. High-quality interfaces and low contamination levels are enabled by such a scenario The pyrolytic photoresist film of the invention is further distinguished in that as a general rule, CVD precursor gases can be purified to a higher degree than can be conventional liquid photoresist solutions. As a result, a CVD photoresist can result in less photoresist contamination by impurities such as sodium. In addition, CVD processes are generally not subject to the shelf-life limitations that can result from degradation of liquid photoresist solutions over time. The pyrolytic CVD photoresist film provided by the invention is thus superior over conventional liquid photoresists in many aspects.

From the foregoing, it is apparent that the pyrolytic chemical vapor deposition processes provided by the invention enable production of pyrolytic CVD silicone films that are characterized by improved mechanical integrity and increased photosensitivity over that of films produced by plasma enhanced chemical vapor deposition processes. The process of the invention eliminates electron impact, ion bombardment, and UV irradiation events characteristic of plasma processes, thereby eliminating film defects such as trapped free radicals, and eliminating the aging properties that are characteristic of plasma polymerized films. The pyrolytic CVD silicone film of the invention finds a wide range of applications, and is superior as a dry-deposited photoresist film for use in microfabrication photolithography. It is recognized, of course, that those skilled in the art may make various modifications and additions to the example deposition processes described above without departing from the spirit and scope of the present contribution to the art. Accordingly, it is to be understood that the protection sought to be afforded hereby should be deemed to extend to the subject matter claims and all equivalents thereof fairly within the scope of the invention.

molecular fragments, while maintaining the structure surface substantially at a temperature that is lower than that of the reactive gaseous phase and that is sufficiently low such that the molecular fragments in the reactive gaseous phase deposit on the structure surface.

2. A method for forming a silicone film on a surface of a structure, comprising the steps of:

exposing an organosilicon compound to a pyrolyzing environment, the conditions of the pyrolyzing environment characterized as producing, in the vicinity of a structure surface on which a silicone film is to be formed, a reactive gaseous phase including organosilicon molecular fragments and including substantially no produced ions or electrons; and while the reactive gaseous phase is in the vicinity of the structure surface, maintaining the structure surface substantially at a temperature that is lower than that of the reactive gaseous phase and that is sufficiently low such that the molecular fragments of the reactive gaseous phase deposit on the structure surface.

| Monomer (or mixture) | Structural formula | Monomer (or mixture) | Structural formula |
|---|---|---|---|
| Tetramethylsilane | $Me_4Si$ | Ethynyltriethoxysilane | $HC\equiv CSi(OEt)_3$ |
|  |  | γ-Aminopropyltriethoxysilane | $H_2N(CH_2)_3Si(OEt)_3$ |
|  |  | Tetraethoxysilane | $(EtO)_4Si$ |
|  |  | Tetraethoxysilane/Oxygen | $(EtO)_4Si/O_2$ |
| Tetramethylsilane/Oxygen | $Me_4Si/O_2$ | Trimethyevinyloxysilane | $Me_3SiOCH=CH_2$ |
| Tetramethylsilane/Ammonia | $Me_4Si/NH_3$ | Tetramethyldisiloxane | $(Me_2SiH)_2O$ |
| Tetramethylsilane/Hydrogen/Argon | $Me_4Si/H_2/Ar$ | Tetramethyldisiloxane/Oxygen | $(Me_2SiH)_2O_2/O_2$ |
| Tetramethylsilane/Tetrafluoromethane | $Me_4Si/CF_4$ | Hexamethyldisiloxane | $(Me_3Si)_2O$ |
| Ethyltrimethylsilane | $EtSiMe_3$ |  |  |
| Vinyltrimethylsilane | $H_2C=CHSiMe_3$ |  |  |
|  |  | Hexamethyldisiloxane/Ammonia | $(Me_3Si)_2O/NH_3$ |
| Vinyltrimethylsilane/Tetrafluoromethane | $H_2C=CHSiMe_3/CF_4$ | Hexamethyldisiloxane/Vinyltrimethylsilane | $(Me_3Si)_2O/H_2C=CHSiMe_3$ |
| Ethynyltrimethylsilane | $HC\equiv CSiMe_3$ | Divinyltetramethyldisiloxane | $(H_2C=CHSiMe_2)_2O$ |
| Ethynyltrmethylsilane/Tetrafluoromethane | $HC\equiv CSiMe_3/CF_4$ |  |  |
|  |  | Hexamethylcyclotrisiloxane | $(Me_2SiO)_3$ |
| Allyltrimethylsilane | $H_2C=CHCH_2SiMe_3$ | Octamethylcyclotetrasiloxane | $(Me_2SiO)_4$ |
| Trimethylchlorosilane | $Me_3SiCl$ |  |  |
| Phenylsilane | $PhSiH_3$ | Dimethylaminotrimethylsilane | $Me_2NSiMe_3$ |
|  |  | Diethylaminotrimethylsilane | $Et_2NSiMe_3$ |
| p-Chlorophenylsilane | $Cl-PhSiH_3$ | Bis(dimethylamino)methylsilane | $(Me_2N)_2SiHMe$ |
| Diphenylsilane | $Ph_2SiH_2$ | Bis(dimethylamino)methyl-vinylsilane | $(Me_2N)_2SiMeCH=CH_2$ |
| Hexamethyldisilane | $(Me_3Si)_2$ |  |  |
|  |  | Hexamethyldisilazane | $(Me_3Si)_2NH$ |
| Bis(trimethylsilyl)methane | $(Me_3Si)_2CH_2$ |  |  |
| Disilylbenzene | $(H_3Si)_2C_6H_4$ |  |  |
| Methyldimethoxysilane/Oxygen | $MeHSi(OMe)_2/O_2$ |  |  |
| Dimethyldimethoxysilane | $Me_2Si(OMe)_2$ | Hexamethyldisilazane/Nitrogen | $(Me_3Si)_2NH/N_2$ |
| Methyltrimethoxysilane | $MeSi(OMe)_3$ | Hexamethyldisilazane/Cyclohexane | $(Me_3Si)_2NH/C_6H_{12}$ |
|  |  | Hexamethyldisilazane/Toluene | $(Me_3Si)_2NH/PhMe$ |
| Methyltrimethoxysilane/Oxygen | $MeSi(OMe)_3/O_2$ | Hexamethylcyclotrisilazane | $(Me_2SiNH)_3$ |
| Vinyltrimethoxysilane | $H_2C=CHSi(OMe)_3$ |  |  |
| Tetramethoxysilane | $(MeO)_4Si$ | Hexamethylcyclotrisilazane/Ammonia | $(Me_2SiNH)_3/NH_3$ |
| Vinyldimethylethoxysilane | $H_2C=CHMe_2SiOEt$ |  |  |
| Vinyldimethylethoxysilane/Styrene | $H_2C=CHMe_2SiOEt/PhCH=CH_2$ | NN'Bis(dimethylsilyl)tetramethylcyclodisilazane | $(Me_2SiNSiHMe_2)_2$ |
| Vinyltriethoxysilane | $H_2C=CHSi(OEt)_3$ | Hexamethyldisilathiane | $(Me_3Si)_2S$ |

We claim:

1. A method for forming a silicone film on a surface of a structure, comprising the step of exposing the structure surface to a reactive gaseous phase having substantially no produced ions or electrons and including organosilicon 3. The method of claim 2 wherein the organosilicon compound comprises a siloxane.

4. The method of claim 2 wherein the organosilicon compound comprises octamethylcyclotetrasiloxane.

5. The method of claim 2 wherein the pyrolyzing environment comprises a resistively-heated conducting filament.

6. The method of claim 1 wherein the reactive gaseous phase is characterized by a temperature that is greater than about 200° C. and that is less than a temperature that would cause thermionic emission from the pyrolyzing environment.

7. The method of claim 2 wherein the pyrolyzing environment is characterized by a temperature that is greater than about 200° C. and that is less than a temperature that would cause thermionic emission from the pyrolyzing environment.

8. The method of either of claims 1 or 2 wherein the structure surface is maintained at a temperature less than about 175° C.

9. The method of either of claims 1 or 2 wherein the structure comprises a length of wire.

10. The method of either of claims 1 or 2 wherein the structure comprises a neural probe.

11. The method of either of claims 1 or 2 wherein the structure comprises a microfabrication substrate.

12. The method of either of claims 1 or 2 wherein the structure comprises a silicon wafer.

13. The method of either of claims 1 or 2 wherein the structure comprises an implantable biomedical device.

14. The method of either of claims 1 or 2 wherein the structure comprises a neurological electrode assembly.

15. The method of claim 2 further comprising a first step of exposing the organosilicon compound to a plasma environment.

16. The method of claim 2 further comprising a last step of exposing the organosilicon compound to a plasma environment.

17. The method of claim 2 wherein the step of exposing the organosilicon compound to a pyrolyzing environment further comprises simultaneously exposing the organosilicon compound to a plasma environment.

18. The methods of any of claims 15, 16, or 17 wherein the plasma environment is produced by continuous plasma excitation power.

19. The methods of any of claims 15, 16, or 17 wherein the plasma environment is produced by plasma excitation power characterized by an excitation duty cycle having alternating intervals in which plasma excitation power is applied and in which no plasma excitation power is applied.

20. The method of claim 2 wherein the step of maintaining the structure surface substantially at a temperature lower than that of the pyrolyzing environment comprises maintaining the substrate at the lower temperature for a time selected to deposit on the structure surface a silicone film of a desired thickness;

and further comprising last steps of:

exposing the deposited silicone film to a pattern of radiation; and etching areas of the silicone film corresponding to the pattern of radiation.

21. The method of claim 20 wherein the step of etching areas of the radiated silicone film comprises exposing the radiated film to a plasma environment, the conditions of the plasma environment selected to etch the silicone film areas.

22. The method of claim 21 wherein the step of exposing the radiated film to a plasma etch environment comprises exposing the radiated film to an oxygen-containing plasma environment.

23. The method of claim 20 wherein the step of exposing the silicone film to a pattern of radiation comprises exposing the film through a patterned mask to radiation of between about 10 nm and about 400 nm in wavelength.

24. The method of claim 20 wherein the steps of maintaining the substrate at the lower temperature for a time selected to deposit on the structure surface a silicone film of a desired thickness; exposing the silicone film to a pattern of radiation; and etching areas of the silicone film are all carried out on a substrate in sequence without exposing the substrate to ambient environment between each step.

* * * * *